United States Patent
Cho et al.

(10) Patent No.: US 8,607,104 B2
(45) Date of Patent: Dec. 10, 2013

(54) MEMORY DIAGNOSTICS SYSTEM AND METHOD WITH HARDWARE-BASED READ/WRITE PATTERNS

(75) Inventors: Hanwoo Cho, Acton, MA (US); Tahsin Askar, Round Rock, TX (US); Philip E. Madrid, Austin, TX (US); Guhan Krishnan, Chelmsford, MA (US); Brian W. Amick, Bedford, MA (US); Shawn Searles, Austin, TX (US); Ryan J. Hensley, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 340 days.

(21) Appl. No.: 12/972,977

(22) Filed: Dec. 20, 2010

(65) Prior Publication Data
US 2012/0159271 A1  Jun. 21, 2012

(51) Int. Cl.
*G06F 11/00* (2006.01)
(52) U.S. Cl.
USPC .......................................................... 714/716
(58) Field of Classification Search
None
See application file for complete search history.

(56) References Cited

U.S. PATENT DOCUMENTS

| | | | |
|---|---|---|---|
| 7,911,861 B2 * | 3/2011 | Ishikawa et al. | 365/201 |
| 8,031,424 B2 * | 10/2011 | Sutardja | 360/51 |
| 8,301,941 B2 * | 10/2012 | Bodrozic et al. | 714/716 |

* cited by examiner

*Primary Examiner* — Christopher McCarthy
(74) *Attorney, Agent, or Firm* — Volpe and Koenig, P.C.

(57) ABSTRACT

A memory loopback system and method including an address/command transmit source configured to transmit a command and associated address through an address/command path. A transmit data source is configured to transmit write data associated with the command through a write path. Test control logic is configured to generate gaps between successive commands. A loopback connection is configured to route the write data from the write path to a read path. A data comparator is configured to compare the data received via the read path to a receive data source and generate a data loopback status output. Pattern generation logic can be configured to generate a loopback strobe, the loopback strobe being coupled to the read path. The pattern generation logic may be configured to synthesize a read strobe based on the test control logic and to use the synthesized read strobe as the loopback strobe. The loopback connection may be configured to route the address/command data from the address/command path to an address/command comparator, the address/command comparator being configured to compare the address/command data to an address/command receive source and generate an address/command loopback status output.

26 Claims, 8 Drawing Sheets ns and
methods, and in particular relates to circuitry for improved
memory loopback and diagnostic modes.

MEMORY DIAGNOSTICS SYSTEM AND METHOD WITH HARDWARE-BASED READ/WRITE PATTERNS

FIELD OF INVENTION

This invention relates to memory interface systems and methods, and in particular relates to circuitry for improved memory loopback and diagnostic modes.

BACKGROUND

The ability to test a circuit completely and inexpensively is an important aspect for integrated circuit products. A loopback mechanism may be used to determine whether transmit and receive data paths are operational. In a loopback scenario, data transmitted along the transmit path is typically coupled to the receive path. The received data is compared with the transmitted data to verify the integrity of the two data paths. Provision of such functionality in integrated circuits (e.g., DRAM controller circuitry) is complex because of the timing differences between the transmit data and receive data. Existing circuitry is often complex and expensive to implement.

SUMMARY OF THE EMBODIMENTS

A memory loopback system and method including an address/command transmit source configured to transmit a command and associated address through an address/command path. A transmit data source is configured to transmit write data associated with the command through a write path. Test control logic is configured to generate gaps between successive commands. A loopback connection is configured to route the write data from the write path to a read path. A data comparator is configured to compare the data received via the read path to a receive data source and generate a data loopback status output.

The system may also include strobe pattern generation logic configured to generate a loopback strobe, the loopback strobe being coupled to the read path. The strobe pattern generation logic may be configured to synthesize a read strobe based on the test control logic and to use the synthesized read strobe as the loopback strobe. The loopback connection may be configured to route the address/command data from the address/command path to an address/command comparator, the address/command comparator being configured to compare the address/command data to an address/command receive source and generate an address/command loopback status output.

The test control logic may include command burst control logic configured to control a number of successive commands and bubble control logic configured to generate gaps between successive commands. A plurality of programmable locations may be configured to store a plurality of parameters for controlling the bubble control logic and the command burst control logic. Data loopback timing logic may be coupled to the bubble control logic, the data loopback timing logic being configured to control transmit data source and receive data source timing.

The system may include a dynamic random access memory (DRAM) controller including the transmit data source, address/command transmit source, data comparator and test control logic and a physical memory interface (Phy) including the loopback connection. The Phy may include a loopback connection configured to route the address/command data from the address/command path to an address/command comparator, the address/command comparator being configured to compare the address/command data to an address/command receive source and generate an address/command loopback status output.

A memory device may be coupled to a write path and a read path, wherein the transmit data source is configured to transmit write data to the memory device. The data comparator may be configured to compare the read data received from the memory device to the receive data source and generate the data loopback status output.

DETAILED DESCRIPTION OF THE EMBODIMENTS

Figure 1:
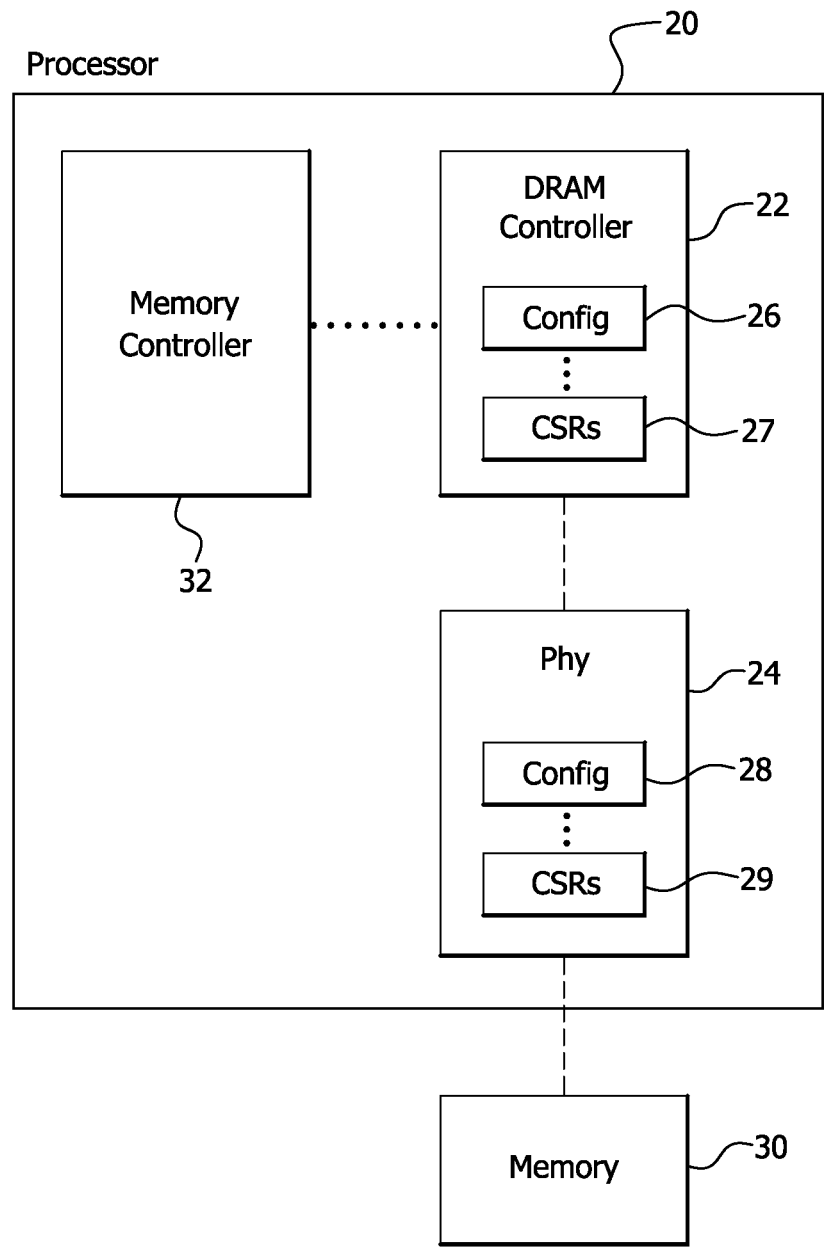
FIG. 1 is a block diagram of a central processing unit with an embedded DRAM controller and Phy interface for coupling to one or more memory devices.

FIG. 1 shows a processor 20 with an embedded dynamic random access memory (DRAM) controller 22 (DCT) and a memory controller 32 (MCT). A physical interface (Phy) 24 resides between the DRAM controller 22 and one or more physical memory devices 30. The memory controller 32 generally includes logic configured to package blocks of data to be written to attached memory devices 30. The DRAM controller 22 includes logic configured to generate read/write commands. The DRAM controller 22 may include one or more configuration ports 26 for access to command and status registers (CSRs) 27, for configuration adjustments. The DRAM controller 22 and Phy 24 are typically located in the processor but may be located elsewhere. The Phy 24 generally includes circuitry for handling the timing requirements of the various memory data strobes. The Phy 24 may include one or more configuration ports 28 for access to CSRs 29 for configuration adjustments. For example, the configuration ports 26 and/or 28 may be used to initiate various loopback modes.

For purposes of this disclosure, the term double data rate (DDR) encompasses DDR1/DDR2/DDR 3 and/or subsequent generations of such memory devices. DDR memory devices typically conform to Joint Electron Devices Engineering Councils (JEDEC) standards. These standards define how DDR memory data is accessed (read), and stored (written). It should be understood that a Phy interface may be constructed to operate with other memory types and/or other memory standards. The interface to a typical DDR SDRAM memory device is accomplished primarily through two signal classes, DQ (data) and DQS (data strobe). Other signals include the Memclk, Pclk as well as address and command signals (ADDR/CMD). Memclk is typically high for one bit interval and low for one bit interval. Pclk is typically high for ½ of one bit interval and low for ½ of one bit interval. It should be understood that typical memory devices may use additional signals that are not shown in the drawing figures. Such signals have been omitted for purposes of clarity only. For example, power and ground signals are not shown. It should be understood that such signals would be included in a typical implementation.

Depending on the processor architecture and/or operating system, memory 30 may transfer data in 32 or 64 bit data units. It should be understood that other data widths may be supported. Some memory systems include multiple channels (e.g., two or more independent DRAM controllers). For purposes of clarity, the examples contained herein may illustrate only a single memory channel. It should be understood that multiple channels may be used without departing from the scope of this disclosure.

Figure 2:
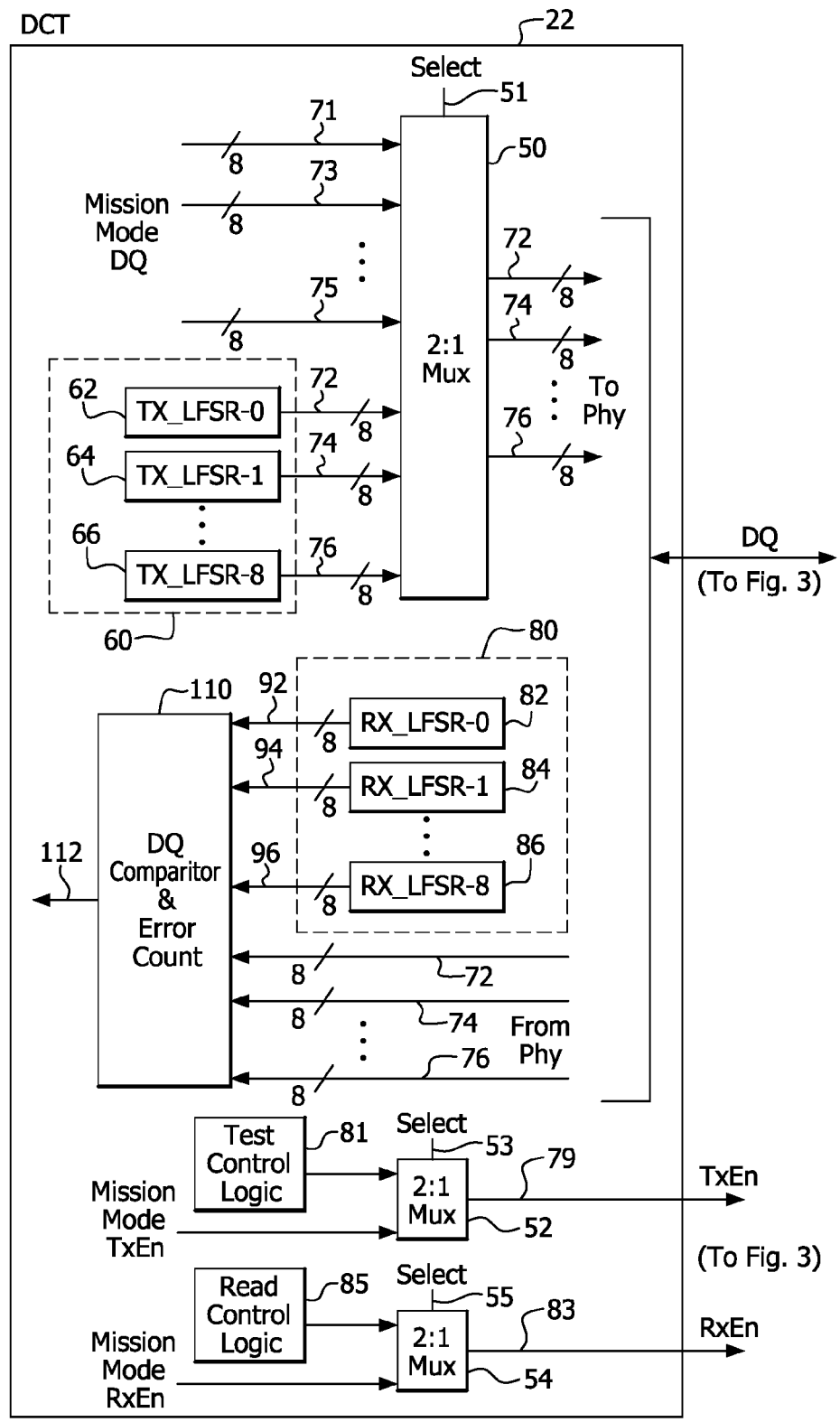
FIG. 2 is a block diagram of data path loopback circuitry contained in the DRAM controller.

FIG. 2 is a block diagram of the data path (DQ) loopback circuitry contained in the DRAM controller 22. A plurality of linear feedback shift registers (LFSR) 62, 64, 66 are configured as a transmit data source 60. The LFSRs 62, 64, 66 (transmit LFSRs) are configured to function as pseudo random number generators. The initial value loaded in the transmit LFSRs 62, 64, 66 is called the seed and because the operation of an LFSR is deterministic, the stream of values produced by the transmit LFSRs 62, 64, 66 is completely determined by the current (or previous) state.

In this particular example, each transmit LFSR 62, 64, 66 is configured to transmit 8 data bits. The data path to memory 30 is 64 bits wide and may also include an error correction code (ECC) byte. Accordingly in an example embodiment, a total of 9 transmit LFSRs may be provided. Other memory widths may be used without departing from the scope of this disclosure. For purposes of clarity, only transmit LFSR-0 (62), LFSR-1 (64) and LFSR-8 (66) are shown. Each transmit LFSR 62, 64, 66 outputs 8 data bits that drive the Phy bidirectional DQ lines. For purposes of clarity, only DQ lines 72, 74 and 76 (8 bits each) are shown. Some of the various enable signals used in connection with bidirectional data communication via DQ lines are omitted for purposes of clarity.

In normal operation, the DRAM controller 22 receives data from the memory controller 32. In loopback mode, the transmit data source 60 supplies data to the Phy 24. DRAM controller 22 includes a 2:1 multiplexer 50 to select between mission mode DQ lines 71, 73, 75 and the transmit data source 60. Select input 51 is generally driven via a CSR setting when loopback mode is selected. In this example, 2:1 multiplexer is shown with the transmit data source 60 selected.

A plurality of linear feedback shift registers (LFSR) 82, 84, 86 are configured as a receive data compare source 80. The LFSRs 82, 84, 86 (receive LFSRs) are also configured as pseudo random number generators. The receive LFSRs 82, 84, 86 are loaded with the same seed as the transmit LFSRs 62, 64, 66. A self seeding technique may be used to seed the receive data compare source 80. Each receive LFSR 82, 84, 86 is configured to receive 8 data bits. In an example embodiment, a total of 9 receive LFSRs may be used. As discussed above, other memory widths may be used without departing from the scope of this disclosure. For purposes of clarity, only receive LFSR-0 (82), LFSR-1 (84) and LFSR-8 (86) are shown. Each receive LFSR 82, 84, 86 outputs 8 data bits that drive an input of the DQ comparator 110. A plurality of receive DQ lines (e.g., 72, 74, 76) are also coupled to the DQ comparator 110 for comparison to the data from the receive data compare source 80.

The comparator generates an output 112. The comparator output information may be assembled into one or more status bits that may be accessed via the configuration ports 26.

DRAM controller 22 includes test control logic 81 configured to generate the TxEn signal used in connection with loopback write operations (line 79). Read control logic 85 is configured to generate the RxEn signal used in connection with loopback read operations (line 83). DRAM controller 22 includes a 2:1 multiplexers 52 and 54. These multiplexers select between mission mode TxEn and RxEn signals and the loopback TxEn and RxEn signals 79 and 83 generated by test control logic 81 and read control logic 85. Select inputs 53 and 55 are generally driven via a CSR setting when loopback mode is selected. In this example, 2:1 multiplexers 52 and 54 are shown with the loopback TxEn and RxEn signals selected 79 and 83.

Figure 3:
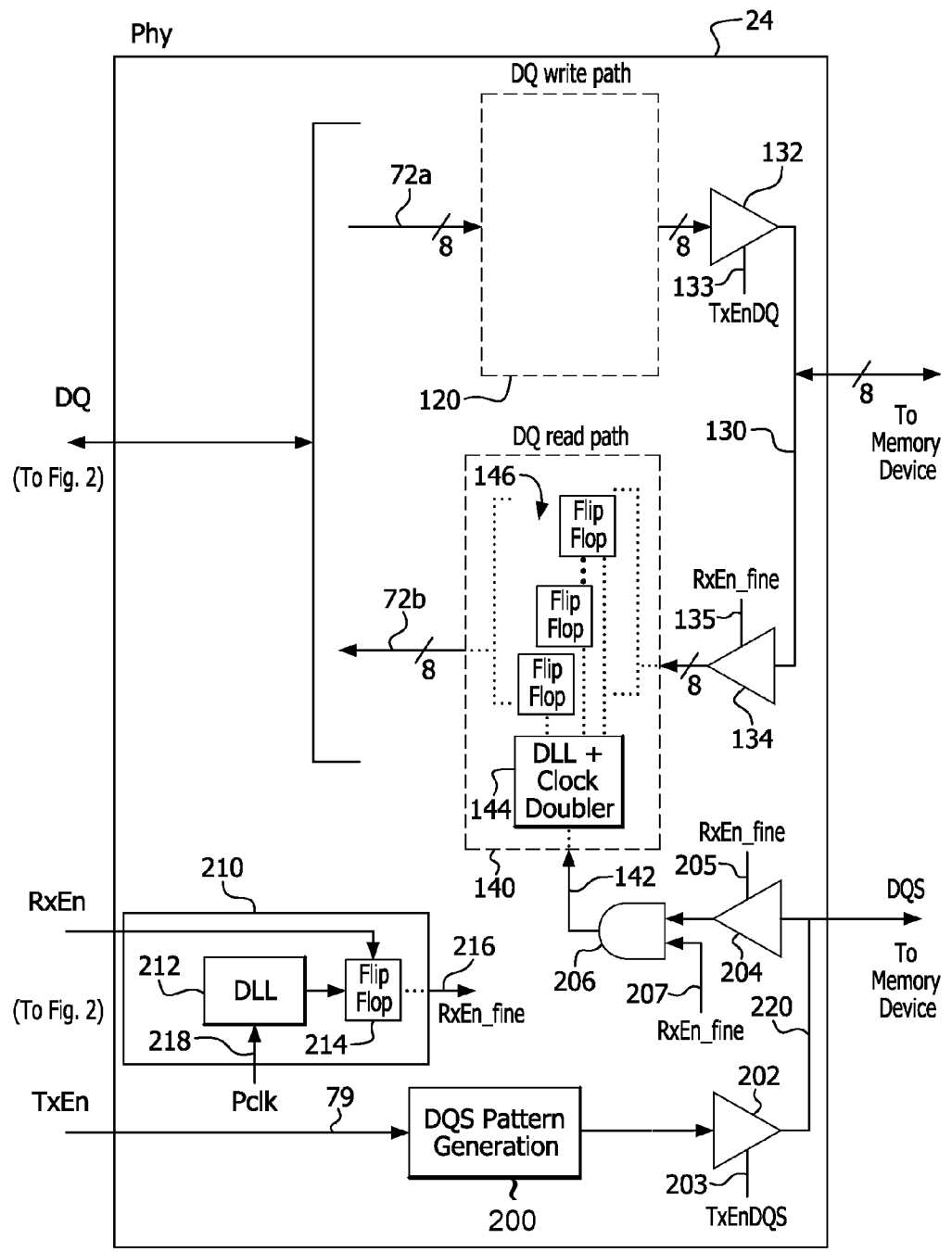
FIG. 3 is a block diagram of the data paths through the Phy during loopback operations.

FIG. 3 is a block diagram of the data paths through the Phy 24 during loopback operation. The Phy 24 includes a plurality of DQ lines to/from DRAM controller 22. The Phy 24 also includes a DQ write path 120 including various circuitry in connection with writing data to a memory device 30. For matters of simplicity only 8 data lines are shown, (e.g., lines 72a and 72b—8 bits each). It should be understood that a portion of the circuitry shown in FIG. 3 is replicated to provide support for the entire data with, (e.g., 64 bits). As discussed above, the DQ lines to memory device 30 are bidirectional. The write and read paths 120, 140 are generally separated in the Phy 24. The DQ write path generally terminates with a driver 132 with a physical connection to the memory device 30 shown by reference number 130. DQ line 130 is bidirectional and is coupled to the DQ read path 140 via receiver 134. It should be understood that in this example reference numbers 132 and 134 represent 8 data bits. Only one line is shown for purposes of clarity. Driver 132 has an enable input 133 (TxEnDQ). Similarly, receiver 134 has an enable input 135 (RxEn_fine). The DQ loopback connection may be accomplished by enabling both enable inputs 133 and 135. This is shown graphically by connection 130. This allows the output of the DQ write path 120 to be electrically coupled to the input 134 of the DQ read path 140. The DQ read path 140 generally includes circuitry in connection with reading data from memory 30. The output of the DQ read path 140 is coupled to the DRAM controller 22 via DQ lines shown generally by reference number 72b. Some of the various enable signals used in connection with bidirectional data communication are omitted for purposes of clarity.

The basic loopback configuration disclosed in FIGS. 1-3 may be used to support several modes of operation. Each of these modes may be initiated via the DRAM controller configuration ports 26 and/or 28. In first mode of operation, legacy loopback mode, data is generated by the DRAM controller 22 via the transmit data source 60. The driver 132 and receiver 134 enable inputs 133, 135 are also enabled. Data is routed through the Phy write path 120. The TxEn signal 79 is generally used to control the timing of the DQ write path as in carrying out a normal write operation.

The DQS path generally terminates with a driver-receiver pair 202, 204 and a physical connection to the memory device 30 shown by reference number 220. In normal, mission mode operation, the DQ read path 140 is only used during read operations. The DQ read path 140 typically receives a read DQS signal generated by the attached memory device 30. The read DQS signal is used to control the timing of the DQ read path 140 circuitry. In loopback mode, the read DQS signal is not present since the attached memory device 30 is not used. The Phy 24 includes DQS pattern generation logic 200 configured to generate a strobe for the DQ read path 140. The DQS pattern generation logic 200 is coupled to drivers 202 and receivers 204 with respective enable inputs 203 and 205. In loopback mode, both drivers 202 and receivers 204 are enabled, routing the output of the DQS pattern generation logic 200 to the DQ read path 140.

In mission mode, DQS pattern generation logic 200 generally provides a DQS signal for write operations. With DDR1/2 memory devices the write preamble is a single bit length (UI) of logic zero. DDR3 have a 2 UI write preamble of 10, (logic one followed by logic zero). For DDR1/2/3 the read preamble is 00, (each bit lasting 1 UI). In loopback mode without an attached memory device, DQS pattern generation logic 200 generally provides an extended preamble time so the output can function as the read strobe during loopback. The extended preamble is at least 00 and may be as much as 00000 to account for the physical delay to get the signal from the driver 203 to AND gate 206. The DQS pattern generation logic 200 output is routed though driver 202 and receiver 204 to an input of AND gate 206. The output AND gate 206 is read strobe 142 used to drive the DQ read path 140. During loopback operations, read strobe 142 functions as the loopback strobe.

RxEn fine control block 210 provides fine timing adjustments (fractions of a UI) for the RxEn signal. Block 210 contains a DLL 212 and a flip flop 214. RxEn (coarse) is coupled to the D input of flip flop 214. The input of DLL 212 is coupled to the Pclk signal 218, (generated by the PLL that synthesizes the overall clock for Phy 24). The output of DLL 212 is coupled to the clock input of flip flop 214. A delay value is programmed into DLL 212 via CSRs so that the RxEn_fine output 216 has the desired fraction UI timing adjustment. The DLL delay value may be determined via training operations. The RxEnvfine output 216 is a copy of the RxEn signal with a suitable fractional UI delay. The RxEn_fine output 216 is used to control the enable inputs of receivers 134 and 204. The RxEn_fine output 216 is also used to gate AND gate 206 to generate the read strobe 142. Fine timing adjustments, (fractions of a UI), of the read strobe are provided by DLL 144.

DQ read path 140 generally includes a DLL and clock doubler 144 coupled to a set of flip flops 146 (one flip flop per bit). The loopback DQ data is coupled to the D input of the flip flops 146. The DLL and clock doubler 144, as driven by the loopback strobe via read strobe input 142, is used to clock flip flops 146. The DQ data is output to the DRAM controller 22 as shown by lines 72b. DLL and clock doubler 144 generally provide a ½ UI delay to clock flip flops 146 in the center of the data eye. The delay value for DLL and clock doubler 144 may be determined via training operations.

The DRAM controller 22 receives the loopback data and compares the received data to the expected values from the receive data compare source 80. The comparator output 112 is generally converted into one or more status bits that may be access via the configuration ports 26 and identify the presence or absence of errors in the loopback data. Data may be transmitted continuously (without regard to read/write commands). This allows for verification of the entire DQ data path without an attached memory device 30. Due to timing delays along the write/read data paths 120, 140, synchronization of the receive LFSRs 82, 84, 86 with the returning "read" data is required. A self seeding process can be used to properly seed and synchronize the receive LFSRs 82, 84, 86. Non-self seeded LFSRs can be used along with start-of-pattern detections for proper alignment.

Figure 4:
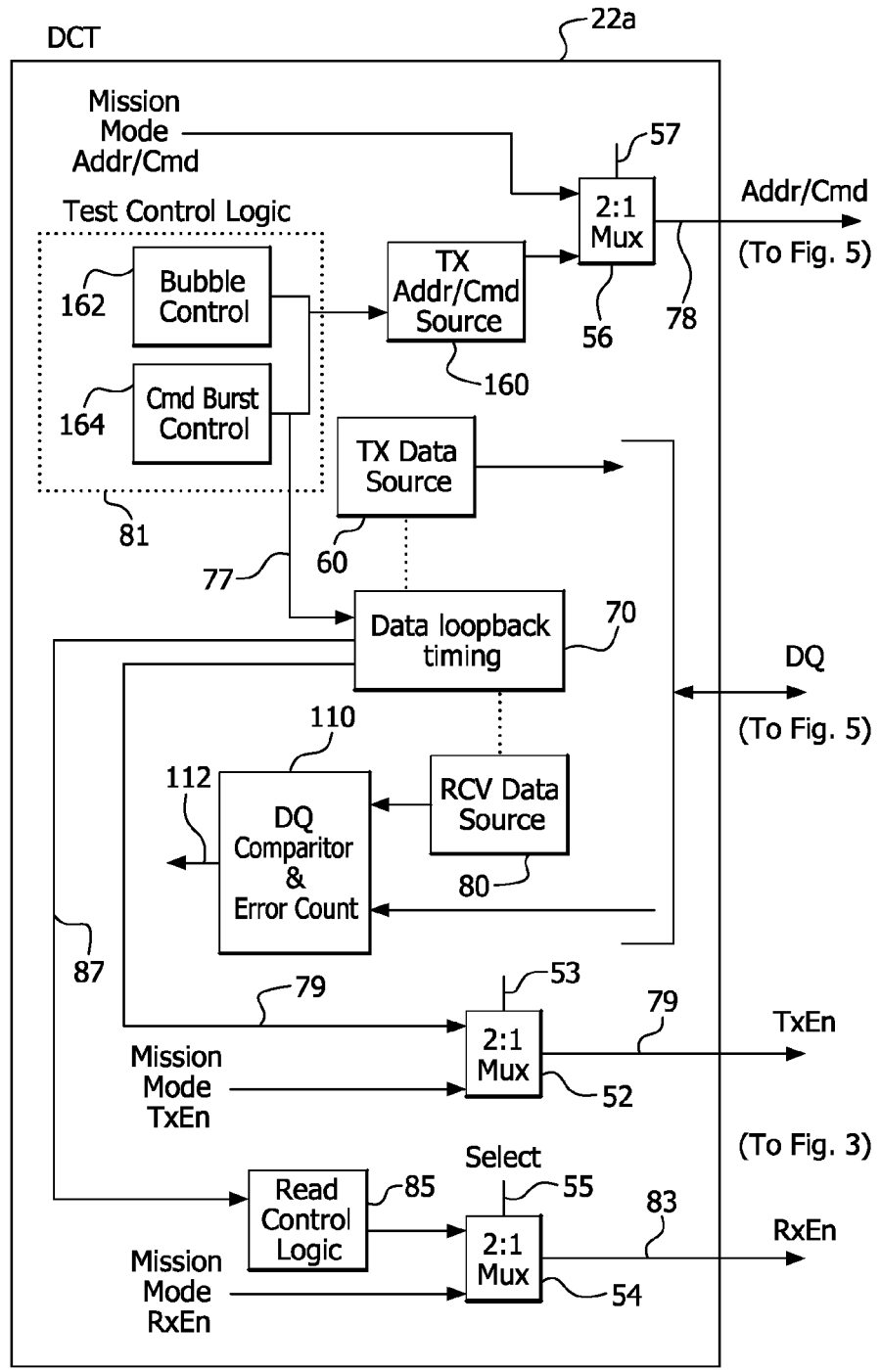
FIG. 4 is a block diagram of DRAM controller with DQ and Address/Command loopback circuitry.

In second mode of operation, loopback operations without an attached memory device 30, both DQ and address/command data is used. Command and address information is generated and looped back. Data is also stopped and started with a programmable pattern. FIG. 4 shows a block diagram of DRAM controller 22a with DQ and Address/Command loopback circuitry. The memory 22a includes a transmit data source 60, and a receive data compare source 80. The transmit data source 60 is configured to send a command with an associated pseudo random address. The specific command, (e.g., write, read and no operation), may be selected via a CSR setting. The number of pseudo random address bits may also be selected via a CSR setting. For example, CSR settings may be provided to mask a portion of the randomly generated address in order to constrain the pseudo randomly generated address range. As discussed in connection with FIG. 2, the DQ loopback data and receive data compare source 80 are coupled to the inputs of the DQ comparator 110. The comparator generates an output 112 with the results of the comparison of the received DQ data and the data from the receive data compare source 80 as discussed above.

The DRAM controller 22a also includes an address/command transmit source 160. The address/command transmit source 160 may be implemented with LFSRs as discussed above. The output of the address/command transmit data source 160 is coupled address/command lines 78 via 2:1 multiplexer 56. It should be understood that a variety of address/command bit widths may be use without departing from the scope of this disclosure. DRAM controller 22a includes test control logic 81. Test control logic 81 is coupled to the address/command transmit source 160 and controls the timing of address/command generation. The output 77 of test control logic 81 is coupled to data loopback timing logic 70. The data loopback timing logic 70 provides a programmable delay so that the transmit data source 60 and receive data source 80 generate properly timed data following address/command generation. The TxEn output 79 is generated by the data loopback timing logic 70. Read control logic 85 is configured to generate the RxEn signal used in connection with read operations, (line 83). Data loopback timing logic 70 also has an output 87 coupled to read control logic 84. Output 87 is configured to sequence RxEn so that the Phy 24a can loopback data without an attached memory device 30. Output 87 is also configured to allow real reads when a memory device 30 is attached.

Test control logic 81 includes bubble control logic 162 and command burst control logic 164 configured to control the timing of address/commands. Command burst control logic 164 is configured to control the total number of commands generated by the transmit address/command source 160 as well as the number of successive commands generated without any gaps or bubbles, (command burst). The bubble control logic 162 is generally configured to control the length of any gaps or bubbles between successive command bursts. The bubble control logic 162 and command burst control logic 164 may access a plurality of programmable locations, (e.g. CSRs 27), configured to store a variety of parameters as shown in Table 1 below:

TABLE 1

| Parameter | Description |
| --- | --- |
| CmdCount | Specifies the total number of commands that will be generated. No additional commands are generated once the number of generated commands reaches CmdCount. |
| CmdStreamLen | Specifies the command burst size, e.g., the number of successive commands without any gaps (bubbles). A value of 1 means 1 command will be generated before bubbles are inserted. A value of FFh means 255 commands will be generated before bubbles are inserted. |
| BubbleCnt | Specifies the number of bubbles between command stream bursts. |

The CmdCount parameter specifies the total number of commands that will be generated during the loopback test.

The CmdStreamLen parameter specifies the number of back-to-back commands, without any bubbles between commands. The BubbleCnt parameter specifies the number bubbles between command streams. These parameters may be used to simulate memory access under a wide range timing conditions, allowing for complete testing of the read/write and command paths.

Figure 5:
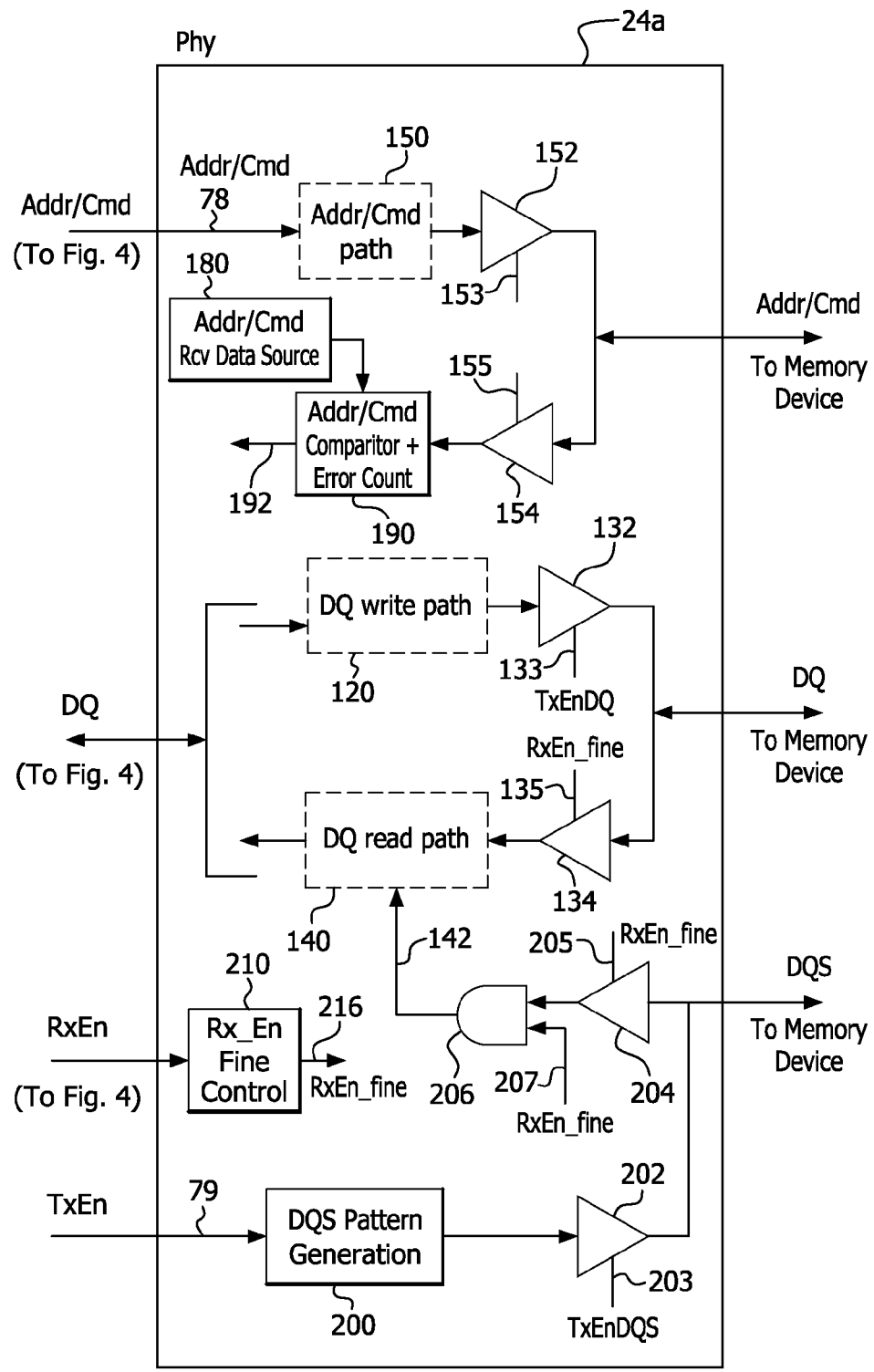
FIG. 5 is a block diagram of a Phy including DQ and address/command loopback circuitry.

FIG. 5 shows a block diagram of a Phy 24a including DQ and address/command loopback circuitry. As discussed above, the Phy 24a includes a plurality of DQ lines to/from DRAM controller 22a. The Phy 24a also includes a DQ write path 120 including various circuitry in connection with writing data to memory 30. The DQ write path generally terminates with driver 132 as discussed above. The input of DQ read path 140 is coupled to receiver 134 as discussed above. The DQ loopback connection is simultaneously accomplished by enabling both enable inputs 133 and 135. This is does not take place during mission mode operation.

As discussed above, in loopback mode, the read DQS signal is not present since the attached memory device is not used. The Phy 24a includes DQS pattern generation logic 200 configured to generate a strobe for the DQ read path 140 during both mission mode and loopback operation. In loopback mode without an attached memory device 30, the pattern generation logic 200 is configured to modify its normal write preamble to look like a read preamble. The DQS pattern generation logic 200 is coupled to driver 202 which is coupled to receiver 204 with respective enable inputs 203 and 205. In loopback mode, both driver 202 and receiver 204 are enabled routing the output of the DQS pattern generation logic 200 to the DQ read path 140. In loopback operations without an attached memory device 30, test control logic 81 and the TxEn output is configured to control the timing of the data bursts. DQS pattern generation logic 200 and RxEn fine control 201 are configured to generate a loopback strobe based on TxEn.

Address/command lines 78 are uni-directional. Accordingly, there is no return path to the DRAM controller 22a. Accordingly, Phy 24a includes circuitry to verify the integrity of the address/command path 150. The address/command path generally terminates with driver 152. A receiver 154 is coupled to address/command comparator 190. The address/command loopback connection is accomplished by enabling both enable inputs 153 and 155. The Phy 24a also includes an address/command receive data source 180. The address/command receive data source 180 may be implemented with LFSRs and may be self seeded as discussed above. Data from the address/command receive data source 180 are coupled to an input of the address/command comparator 190. The transmitted address/command data is also coupled to the address/command comparator 190 for comparison to the data from the address/command receive data source 180. The address/command comparator 190 generates an output 192. The output information 192 may include one or more status bits that may be accessed via the configuration ports 28 and identify the presence or absence of errors in the address/command data.

In loopback operations without an attached memory device 30, all commands function as both write commands and read commands. All data generated by the transmit data source 60 is routed through the DQ write path 120, (simulating a write operation), and is looped back through the DQ read path 140, (simulating a read operation). The data loopback timing logic 70 is configured to synchronize receive data source 80 with the incoming loopback data.

Figure 6:
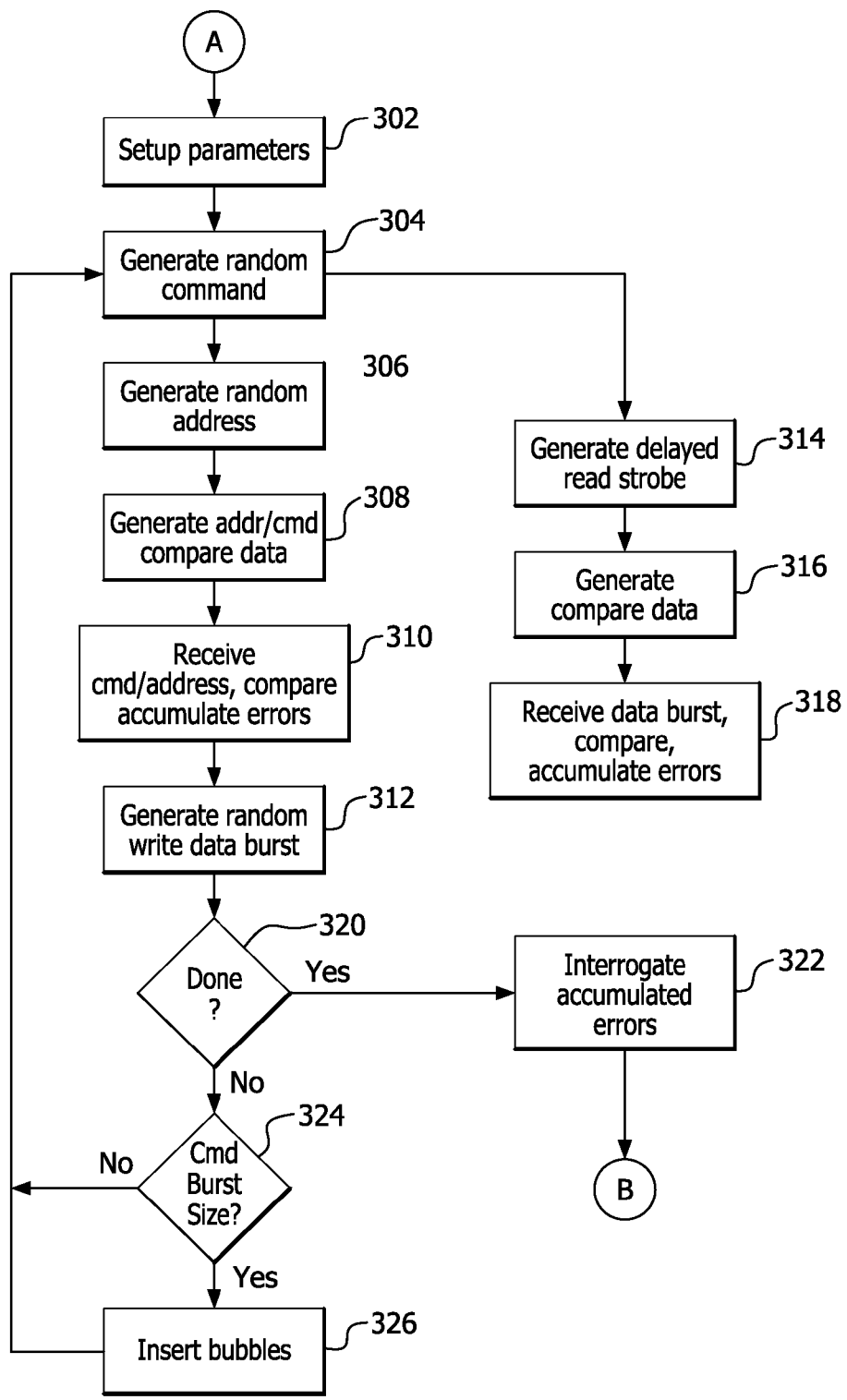
FIG. 6 is a flowchart showing loopback operation without an attached memory device.

FIG. 6 is a flowchart showing loopback operation without an attached memory device 30. In this case the logic must create both read and write events so that both RxEn and TxEn are activated. This is accomplished by proper timing of RxEn following the assertion of TxEn as discussed above. It should be understood that any flowcharts contained herein are illustrative only and that other entry and exit points, time out functions, error checking functions and the like that are not shown would normally be implemented in a typical system. Any beginning and ending blocks are intended to indicate logical beginning and ending points for a given subsystem that may be integrated into a larger device and used as needed. The order of the blocks may also be varied without departing from the scope of this disclosure. Implementation of these aspects is readily apparent and well within the grasp of those skilled in the art based on the disclosure herein.

The logic is setup with parameters such as LFSR seeds, CmdCount, CmdStreamLen and BubbleCnt and the like as shown by block 302. It should be understood that the left hand leg of FIG. 6 generally relates to write operations. The right hand leg of FIG. 6 generally relates to read operations. It should also be understood that without an attached memory device, the logic will treat a random command as a write command and then automatically generate a read strobe to read loopback data. Starting with the left hand leg, a random command is generated via the address command source 160 (block 304). A random address is then generated by the address command source 160 (block 306). The address/command receive data source 180 is properly seeded and configured to generate compare data (block 308). The command and address are received via address/command comparator 190 and is compared to the address/command receive data source 180. An error count is accumulated and the results are available via output 192, (e.g., via the configuration ports 28) as shown by block 310. The address/command is then followed by a burst of data as shown by block 312, (e.g., via transmit data source 60). In this example the data width is 64 bits. A typical burst depth may be eight successive 64 words of data. Typically, data bursts have a depth selected in multiples of 8. The data burst depth may be specified by a CSR parameter. It should be understood that a wide variety of data burst depths may be used without departing from the scope of this disclosure.

Proceeding to the right hand leg of FIG. 6, a delayed read strobe is generated (block 314). The receive data source 80 is properly seeded and configured to generate compare data (block 316). The data is received via DQ comparator 112 and is compared to the receive data source 80. An error count is accumulated and the results are available via output 112, (e.g., via configuration ports 26) as shown by block 318.

Returning to the left hand leg of FIG. 6, once the data burst is complete, the logic checks to see if CmdCount has been reached (block 320). If CmdCount has been reached, the loopback operation is complete and accumulated errors can be interrogated via the appropriate CSRs (block 322). If CmdCount has not been reached, the logic checks to see if CmdStreamLen has been reached (block 324). If CmdStreamLen has been reached, then bubbles are inserted as specified by BubbleCnt (block 326) and the logic continues at block 304. A bubble is generally no shorter than 2 data bits (2 UI) long and can extend to an arbitrary length providing a gap between command streams. It is understood other bubble sizes may be used without departing from the scope of this disclosure.

A third mode of operation, hardware-based test mode, is also supported. One or more memory devices 30 are attached to the Phy 24a. Operation of the DRAM controller 22a and Phy 24a are similar to loopback operations without an attached memory device 30 as discussed above. In hardware-based test mode, a more sophisticated pattern can be used for loopback operations with an attached memory device 30 This may allow the reads to penetrate into the writes with suitable setup of the configuration space. Referring to FIG. 4, the transmit data source 60 is configured to generate data for write operations. The receive data compare source 80 is configured to compare to data received from read operations. Bubble control logic 162 is configured to control the timing of address and command generation. Unlike loopback without an attached memory device 30, the data loopback timing logic 70 is configured to control the timing with respect to discrete write and read operations. For example, a write command is issued and a burst of data is written beginning at a given address in memory device 30. This process may be repeated as desired.

Once write operations are complete, the data may be verified by initiating one or more read commands. Returning to FIG. 4, the receive data compare source 80 is also typically seeded to match write operations. The receive data compare source 80 generates compare data and the comparator 110 generates output 112 with the results of the comparison of the received data from the memory device 30.

Referring to FIG. 5, Phy 24a may also be configured for operation with an attached memory device 30. The address/command path is verified as discussed above in connection with loopback operations without an attached memory device 30. The DQ write path driver 132 and DQ read path receiver 134 are enable using separate and conventional read and write operations, (e.g., enable lines 133 and 135 are operated normally such that only one be enabled at any point in time). In loopback operation with an attached memory device 30, the read DQS signal is provided from the attached memory device 30. DQS pattern generation logic 200 is configured to pass the write DQS strobe to the attached memory device 30 during write operations. During read operations, the DQS pattern generation logic 200 is not used since the read DQS strobe is provided by the attached memory device 30.

Figure 7:
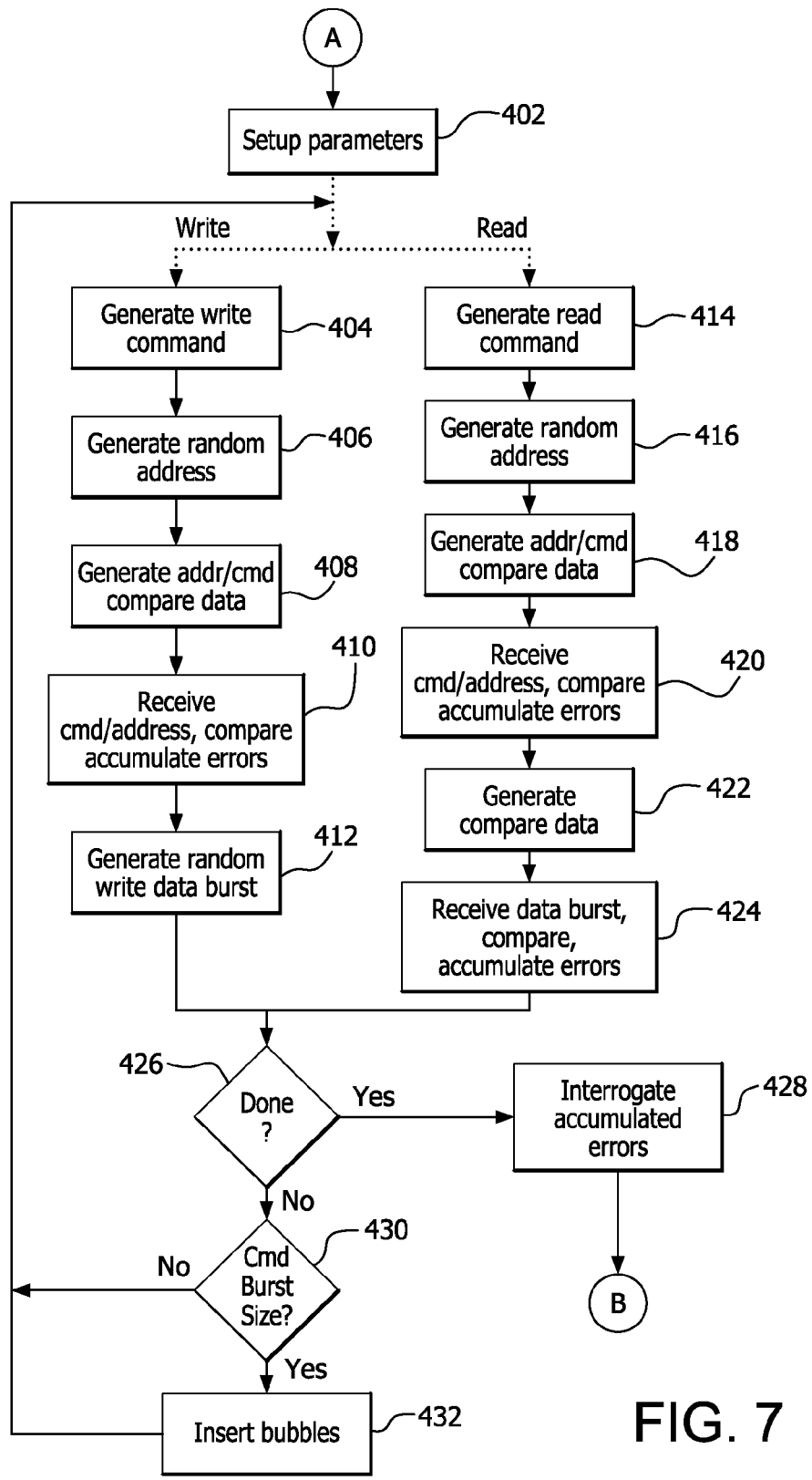
FIG. 7 is a flowchart showing loopback operation with an attached memory device.

FIG. 7 is a flow chart showing loopback operations with an attached memory device 30. The logic is setup with parameters such as LFSR seeds, CmdCount, CmdStreamLen and BubbleCnt and the like as shown by block 402. Typically, the various parameters may be set to mirror write operation. It should be understood that the various parameters may be varied. For example, the CmdCount, CmdStreamLen and BubbleCnt parameters could be varied to change the timing of read operations. It should be understood that the left hand leg of FIG. 7 generally relates to write operations. The right hand leg of FIG. 7 generally relates to read operations. It should also be understood that separate read and write commands are generated depending on parameter settings. Starting with the left hand leg, a write command is generated via the address command source 160 as shown by block 404. A random address is then generated by the address command source 160 as shown by block 406. The address/command receive data source 180 is properly seeded and configured to generate compare data as shown by block 408. The command and address are received via address/command comparator 190 and are compared to the address/command receive data source 180. An error count is accumulated and the results are available via output 192, (for example via the configuration ports 28) as shown by block 410. The address/command is then followed by a burst of data as shown by block 412, (for example via transmit data source 60). The data burst depth may be specified by a CSR parameter. It should be understood that multiple data bursts can be written to the attached memory device 30. Once the desired data is written to memory device 30, the data can be read and verified.

Proceeding to the right hand leg of FIG. 7, a read command is generated at block 414. A random address is then generated by the address command source 160 as shown by block 416. The address/command receive data source 180 is properly seeded and configured to generate compare data as shown by block 418. The command and address are received via address/command comparator 190 and are compared to the address/command receive data source 180. An error count is accumulated and the results are available via output 192, (e.g., via the configuration ports 28) as shown by block 410. The receive data source 80 is properly seeded and configured to generate compare data as shown by block 422. The data is received via DQ comparator 112 and is compared to the receive data source 80. An error count is accumulated and the results are available via output 112, (e.g., via configuration ports 26) as shown by block 424.

Once the data burst is complete, the logic checks to see if CmdCount has been reached as shown by block 426. If CmdCount has been reached, the loopback operation is complete and accumulated errors can be interrogated via the appropriate CSRs as shown by block 428. If CmdCount has not been reached, the logic checks to see if CmdStreamLen has been reached as shown by block 430. If CmdStreamLen has been reached, then bubbles are inserted as specified by BubbleCnt as shown by block 432 and the logic continues at block 404 or 414 depending on whether a write or read operation is selected.

Loopback operation with an attached memory device 30 provides a mechanism for testing operation of the DRAM controller 22a, Phy 24a and attached memory 30 with accurate timing controls. The address/command source 160 and the transmit data source 60 are not subject to delays that are inherently introduced during loopback operations carried out under software control, e.g., due to operating system overhead. This allows for more rigorous testing of the memory system in a shorter period of time.

Figure 8:
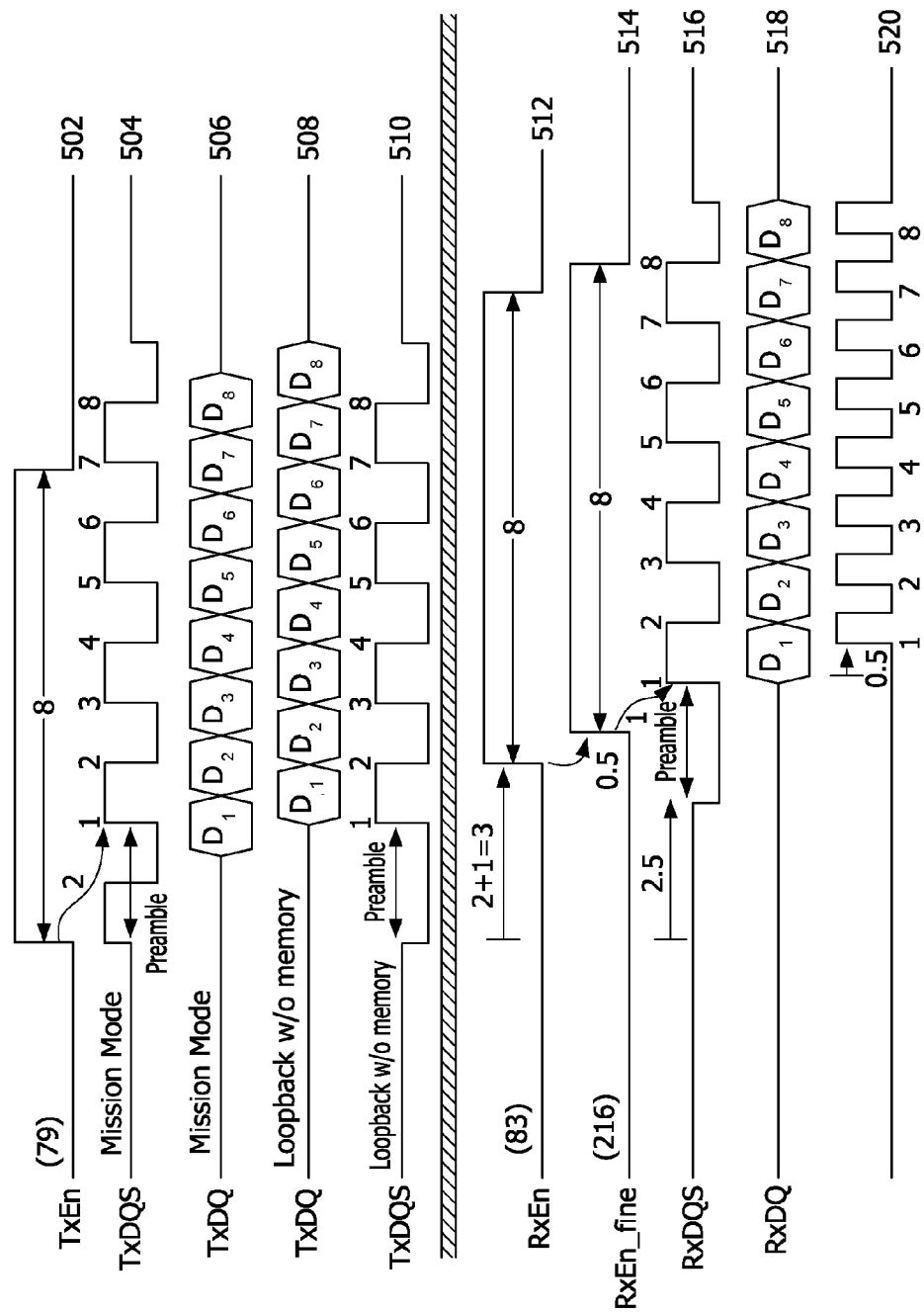
FIG. 8 is a timing diagram showing the timing of DQ and DQS relative to TxEn and RxEn.

FIG. 8 is a timing diagram showing the timing of DQ and DQS relative to TxEn 79 and RxEn 83. The upper portion of FIG. 8 is directed to write operations. The lower portion of FIG. 8 is directed to read operations. TxEn is generally asserted for 8 UI (8 data bits) as shown by line 502. During normal, mission mode, write operations with an attached memory device, DQS includes a preamble (dependent on memory type) and a continuous pattern as shown by line 504. DQ is generally clocked on alternate rising and falling edges of DQS as shown by line 506. In loopback mode, without an attached memory, DQS begins with a 2UI preamble followed by a continuous pattern (line 510). DQS can be edge aligned with the DQ (line 508).

Proceeding to the lower portion of FIG. 8, RxEn_fine 216 is asserted for 8 UI and has its rising edge aligned in the middle of the RxDQS preamble (lines 514 and 516). In this example, RxEn_fine is asserted 3.5 UI after the rising edge of TxEn 79. Data loopback timing logic 70 provides a 3 UI integer delay, causing the rising edge of RxEn 83, (line 512), to follow TxEn 79, (line 502), by 3 UI. DLL 212 is programmed for a fractional delay of 0.5 UI, causing RxEn_fine to rise 0.5 UI after RxEn 83. RxDQS and RxDQ are edge aligned, as would occur in mission mode (lines 516 and 518). RxDQS is then delayed by ½ UI for proper clocking of data via DLL and clock doubler 144 (line 520).

It should be understood that many variations are possible based on the disclosure herein. Although features and elements are described above in particular combinations, each feature or element may be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the present invention.

What is claimed is:

1. A memory loopback system comprising:
    an address/command transmit source configured to transmit address/command data through an address/command path;
    a transmit data source configured to transmit write data associated with the address/command through a write path;
    test control logic configured to control timing between successive commands;
    a loopback connection configured to route the write data from the write path to a read path;
    a data comparator configured to compare the data received via the read path to a receive data source and generate a data loopback status output;
    wherein the test control logic comprises command burst control logic configured to control a number of successive commands and bubble control logic configured to generate gaps between successive commands; and
    a plurality of programmable locations configured to store a plurality of parameters for controlling the bubble control logic and the command burst control logic.

2. The system of claim 1 wherein the data loopback status output includes at least one bit configured to identify an error in the data received via the read path.

3. The system of claim 1 further comprising strobe pattern generation logic configured to generate a loopback strobe, the loopback strobe being coupled to the read path.

4. The system of claim 3 wherein the strobe pattern generation logic is configured to synthesize a read strobe based on the test control logic and to use the synthesized read strobe as the loopback strobe.

5. The system of claim 1 further comprising: a loopback connection configured to route the address/command data from the address/command path to an address/command comparator, the address/command comparator being configured to compare the address/command data to an address/command receive source and generate an address/command loopback status output.

6. The system of claim 5 wherein the address/command loopback status output includes at least one bit configured to identify an error in the address/command data received via the address/command path.

7. The system of claim 1 further comprising data loopback timing logic coupled to the bubble control logic, the data loopback timing logic being configured to control transmit data source and receive data source timing.

8. The system of claim 1 further comprising a dynamic random access memory (DRAM) controller including the transmit data source, address/command transmit source, data comparator and test control logic and a physical memory interface (Phy) including the loopback connection.

9. The system of claim 8 wherein the Phy includes a loopback connection configured to route the address/command data from the address/command path to an address/command comparator, the address/command comparator being configured to compare the address/command data to an address/command receive source and generate an address/command loopback status output.

10. The system of claim 8 further comprising a memory device coupled to the write path and read path, wherein the transmit data source is configured to transmit write data to the memory device.

11. The system of claim 10 wherein the data comparator is configured to compare the read data received from the memory device to the receive data source and generate the data loopback status output.

12. The system of claim 1 wherein the Phy includes a loopback connection configured to route the address/command data from the address/command path to an address/command comparator, the address/command comparator being configured to compare the address/command data to an address/command receive source and generate an address/command loopback status output.

13. A memory loopback method comprising:
    transmitting address/command data through an address/command path;
    transmitting write data associated with the command through a write path;
    controlling timing between successive commands;
    providing a loopback connection configured to route the write data from the write path to a read path;
    comparing data received via the read path to a receive data source and generating a data loopback status output;
    providing command burst control logic configured to control a number of successive commands and bubble control logic configured to generate gaps between successive commands; and
    storing a plurality of parameters for controlling the bubble control logic and the command burst control logic.

14. The method of claim 13 wherein the data loopback status output includes at least one bit configured to identify an error in the data received via the read path.

15. The method of claim 13 further comprising generating a loopback strobe, the loopback strobe being coupled to the read path.

16. The method of claim 15 further comprising synthesizing a read strobe based and using the synthesized read strobe as the loopback strobe.

17. The method of claim 13 further comprising routing the address/command data from the address/command path to an address/command comparator, comparing the address/command data to an address/command receive source and generating an address/command loopback status output.

18. The method of claim 13 further comprising providing data loopback timing logic coupled to the bubble control logic, the data loopback timing logic being configured to control transmit data source and receive data source timing.

19. The method of claim 13 further comprising providing a dynamic random access memory (DRAM) controller including a transmit data source, address/command transmit source, data comparator and test control logic and a physical memory interface (Phy) including the loopback connection.

20. The method of claim 19 wherein the Phy includes a loopback connection configured to route the address/command data from the address/command path to an address/command comparator, the address/command comparator being configured to compare the address/command data to an address/command receive source and generate an address/command loopback status output.

21. The method of claim 13 further comprising providing a memory device coupled to the write path and read path, wherein the write data is transmitted to the memory device.

22. The method of claim 21 wherein read data received from the memory device is compared to the receive data source to generate the data loopback status output.

23. The method of claim 13 wherein the Phy includes a loopback connection configured to route the address/command data from the address/command path to an address/command comparator, the address/command comparator being configured to compare the address/command data to an address/command receive source and generate an address/command loopback status output.

24. A non-transitory computer readable media including hardware design code stored thereon, and when processed generates mask works for a dynamic random access memory (DRAM) controller including a transmit data source, address/command transmit source, data comparator and test control logic and physical memory interface (Phy) including a loopback connection that are configured to perform a memory loopback method comprising:
    transmitting a address/command data through an address/command path;
    transmitting write data associated with the command through a write path;
    controlling timing between successive commands;
    providing the loopback connection configured to route the write data from the write path to a read path;
    comparing data received via the read path to a receive data source and generating a data loopback status output;
    providing command burst control logic configured to control a number of successive commands and bubble control logic configured to generate gaps between successive commands; and
    storing a plurality of parameters for controlling the bubble control logic and the command burst control logic.

25. The non-transitory computer readable media of claim 24 wherein the data loopback status output includes at least one bit configured to identify an error in the data received via the read path.

26. The non-transitory computer readable media of claim 24 wherein the Phy includes a loopback connection configured to route the address/command data from the address/command path to an address/command comparator, the address/command comparator being configured to compare the address/command data to an address/command receive source and generate an address/command loopback status output.

* * * * *